(12) United States Patent
Masuda et al.

(10) Patent No.: US 7,492,218 B2
(45) Date of Patent: Feb. 17, 2009

(54) DIGITAL AMPLIFIER APPARATUS AND METHOD OF RESETTING A DIGITAL AMPLIFIER APPARATUS

(75) Inventors: Toshihiko Masuda, Tokyo (JP); Yusuke Yamamoto, Kanagawa (JP); Arihiro Moroboshi, Tokyo (JP)

(73) Assignee: Sony Corporation (JP)

( * ) Notice: Subject to any disclaimer, the term of this patent is extended or adjusted under 35 U.S.C. 154(b) by 90 days.

(21) Appl. No.: 11/645,208

(22) Filed: Dec. 22, 2006

(65) Prior Publication Data

US 2007/0188221 A1     Aug. 16, 2007

(30) Foreign Application Priority Data

Dec. 28, 2005     (JP)     ............................. P2005-380368

(51) Int. Cl.
   *H03F 3/38*     (2006.01)
(52) U.S. Cl. ..................... 330/10; 330/207 A
(58) Field of Classification Search ............... 330/10, 330/207 A, 251; 375/238; 381/94.5
   See application file for complete search history.

(56) References Cited

U.S. PATENT DOCUMENTS 7,058,464 B2 *   6/2006   Mallinson .................. 700/94

7,205,917 B2 *   4/2007   Magrath ..................... 341/143

FOREIGN PATENT DOCUMENTS

JP      2004-214998 A     7/2004

* cited by examiner

*Primary Examiner*—Steven J Mottola
(74) *Attorney, Agent, or Firm*—Lerner, David, Littenberg, Krumholz & Mentlik, LLP

(57) ABSTRACT

A digital amplifier apparatus includes a gain-adjusting section operable to adjust a gain of a digital audio signal; a dither-superposing section operable to superpose a predetermined dither on the digital audio signal; a pulse-width-modulated signal generating section operable to generate a pulse-width-modulated signal corresponding to the digital audio signal; an amplifying section operable to cause a switching element to perform a switching operation in accordance with the pulse-width-modulated signal; a pulse-width changing section operable to change a ratio between a "high" state and a "low" state of the pulse-width modulated signal; a synchronizing section operable to synchronize the pulse-width modulated signal with a reset signal that resets the digital audio signal; and a control section operable to perform a resetting operation by setting the gain of the digital audio signal to a zero level upon receiving the reset signal, stopping the superposing of the dither to thereby generate the pulse-width modulated signal, and setting the pulse-width modulated signal to the "low" state by using the pulse-width modulated signal synchronized with the reset signal, thereby causing the switching element to stop performing the switching operation.

7 Claims, 7 Drawing Sheets

DIGITAL AMPLIFIER APPARATUS AND METHOD OF RESETTING A DIGITAL AMPLIFIER APPARATUS

CROSS-REFERENCE TO RELATED APPLICATIONS

The present application claims priority from Japanese Patent Application No. JP2005-380368 filed on Dec. 28, 2005, the disclosure of which is hereby incorporated by reference herein.

BACKGROUND OF THE INVENTION

1. Field of the Invention

The present invention relates to a digital amplifier apparatus and a method of resetting a digital amplifier apparatus. The invention is suitable for application to digital amplifiers (D-class amplifiers) of, for example, Pulse-Width Modulation (PWM) type.

2. Description of the Related Art

Hitherto, with audio apparatuses incorporating a digital amplifier, the user may push the reset or mute button, thus performing a reset or mute operation, while the speaker is generating sound. Then, the speaker is forcedly stopped, ceasing to generate sound.

At the time when the user performs the reset operation, the application of a gate voltage to the gate of the Metal Oxide Semiconductor-Field Effect Transistor (MOS-FET), i.e., the switching element of the PWM-signal amplifying unit, is stopped, setting the MOS-FET into a high-impedance state. The speaker connected to the output of the MOS-FET is thereby made to stop generating sound.

More specifically, in the PWM-signal amplifying unit 1 shown in FIG. 2, an PWM signal P1(+) and a PWM signal P1(−), both received from a PWM-signal generating circuit (not shown) connected to the input of the unit 1, are supplied to the gates of transistors Tr1 and Tr2, MOS-FETs, respectively. Therefore, the transistors Tr1 and Tr2 are alternately turned on and off.

Similarly, in the PWM-signal amplifying unit 1, a PWM signal P2(+) and a PWM signal P2(−), both received from the PWM-signal generating circuit, are supplied to the gates of transistors Tr3 and Tr4, MOS-FETs, respectively. Therefore, the transistors Tr3 and Tr4 are alternately turned on and off.

Thus, in the PWM-signal amplifying unit 1, when the transistor Tr1 and the transistor Tr2 are turned on and off, respectively, and the transistor Tr3 and the transistor Tr4 are turned off and on, respectively, a drive current iA that corresponds to the PWM output OUT1 of the transistors Tr1 and Tr2 is supplied via a low-pass filter LPF1 to a speaker SP.

In the PWM-signal amplifying unit 1, too, when the transistor Tr3 and the transistor Tr4 are turned on and off, respectively, and the transistor Tr1 and the transistor Tr2 are turned off and on, respectively, a drive current iB that corresponds to the PWM output OUT2 of the transistors Tr3 and Tr4 is supplied via a low-pass filter LPF2 to the speaker SP.

That is, in the PWM-signal amplifying unit 1, potential differences d1 and d2 develop between the PWM output OUT1 and the PWM output OUT2 as shown in FIGS. 3A and 3B if the PWM output OUT1 and PWM output OUT2 have different duty ratios. The drive currents iA and iB, which correspond to the PWM outputs OUT1 and OUT2, respectively, therefore flow to the speaker SP. As a result, the speaker SP generates sound.

In the PWM-signal amplifying unit 1, no potential differences develop between the PWM output OUT1 and PWM output OUT2 as shown in FIG. 3C if the PWM output OUT1 and PWM output OUT2 have the same duty ratio of 50% and are completely in the same phase. If this is the case, neither drive current iA nor drive current iB flows to the speaker SP. Hence, the speaker SP stops generating sound and assumes an anacoustic state. Hereinafter, a signal or signals indicated to be at or to have an anacoustic level may be considered as a signal or signals which are utilized to enable the speaker to be in an anacoustic state. Likewise, a signal or signals indicated to not have an anacoustic level may be considered as a signal or signals which do not enable the speaker to be in an anacoustic state.

A digital amplifier based on a technical concept similar to this is known (see, for example, Jpn. Pat. Appln. Laid-Open Publication No. 2004-214998). In this amplifier, to set the audio output of the speaker SP into an acoustic state, the input audio signal is multiplied by a coefficient "0," converting the same to a digital audio signal at the anacoustic level. From the digital audio signal, a PWM-signal generating unit connected to the input of the speaker SP generates a PWM signal having a duty ratio of 50%.

In the digital amplifier thus configured, a digital audio signal, which does not have the anacoustic level as the signal already input to the digital filter, is input to the PWM-signal generating unit before the user performs an operation to set the sound volume to zero. Hence, the anacoustic PWM-signal generating unit connected to the output of the PWM-signal generating unit generates a PWM signal having a duty ratio of 50%, thereby setting the digital audio signal into the anacoustic state.

Therefore, the digital amplifier disclosed in Jpn. Pat. Appln. Laid-Open Publication No. 2004-214998 needs to have not only an anacoustic PWM-signal generating unit that is connected to the output of the PWM-signal generating unit, but also a coefficient-detecting unit for detecting whether an operation has been performed to set the sound volume to zero. The digital amplifier will inevitably be complex in structure and have a large size.

The present invention has been made in consideration of the foregoing. The purpose of the invention is to propose a digital amplifier apparatus and a method of resetting a digital amplifier apparatus, each capable of stopping an audio output means, without generating noise with a simple configuration when a resetting is performed.

SUMMARY OF THE INVENTION

To achieve this purpose, the gain of a digital audio signal is adjusted in the present invention. A predetermined dither is superposed on the digital audio signal, and a pulse-width modulated signal corresponding to the digital audio signal having the dither is then generated. In accordance with the pulse-width modulated signal, the switching elements of an amplifying section are operated, thereby performing amplification. At this time, a reset command may be recognized by receiving a predetermined reset signal. In this case, the gain of the digital audio signal is restricted to a zero level, and the superposing of the dither is stopped. Then, a pulse-width modulated signal corresponding to the digital audio signal with the gain thus adjusted is generated. Using the pulse-width modulated signal, the operation of the switching elements of the amplifying section is terminated, thereby stopping the supply of a drive current to the audio output that is connected to the output of the amplifying section.

Hence, the gain of the digital audio signal is restricted, thereby stopping the superposing of the dither, when the abrupt receipt of a reset command is recognized while sound is being generated. A pulse-width modulated signal at an anacoustic level is thereby generated. Using this pulse-width modulated signal, the operation of the switching elements is terminated, stopping the supply of the drive current to the audio output. Thus, the audio output can be shifted from the sound-generating state to the anacoustic state without generating noise.

According to the present invention, the gain of the digital audio signal is restricted, thereby stopping the superposing of the dither, when the abrupt receipt of a reset command is recognized while sound is being generated. A pulse-width modulated signal at an anacoustic level is thereby generated. Then, using this pulse-width modulated signal, the operation of the switching elements is terminated, thereby stopping the supply of the drive current to the audio output. The audio output can therefore be shifted from the sound-generating state to the anacoustic state without generating noise. Hence, the invention can provide a digital amplifier apparatus and a method of resetting a digital amplifier apparatus, each capable of stopping an audio output without generating noise when a resetting operation is performed, by using a simple configuration with no additional circuits.

The nature, principle and utility of the invention will become more apparent from the following detailed description when read in conjunction with the accompanying drawings in which like parts are designate by like reference numerals or characters.

DETAILED DESCRIPTION

An embodiment of the present invention will be described, with reference to the accompanying drawings.

(1) Configuration of the Digital Amplifier Apparatus

Figure 4:
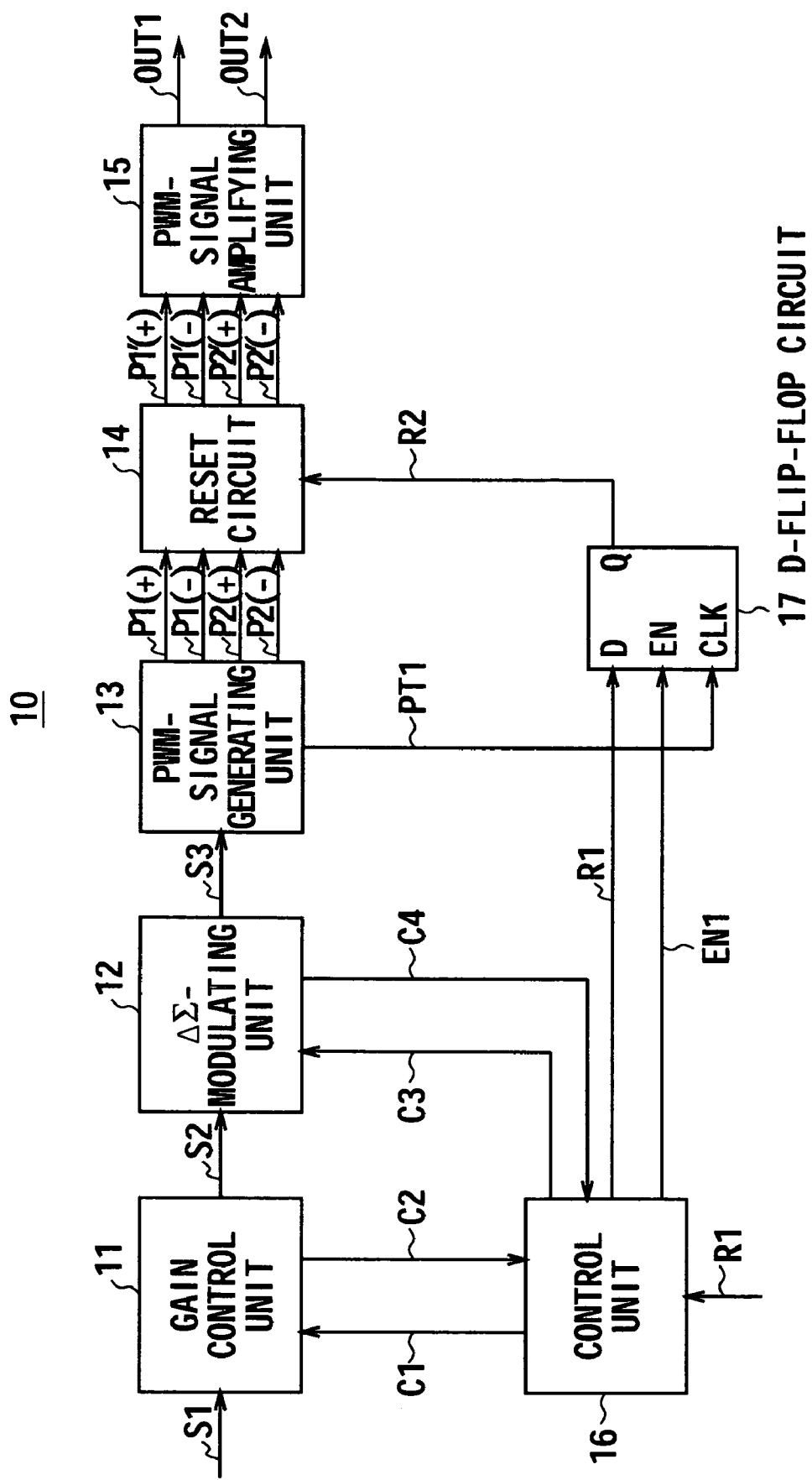
FIG. 4 is a schematic block diagram showing the configuration of a digital amplifier apparatus according to the embodiment of the present invention.

FIG. 4 shows a digital amplifier apparatus 10 according to an embodiment of this invention. A control unit 16 constituted by a Central Processing Unit (CPU) controls the other components of the apparatus 10. The apparatus 10 includes a gain control unit 11, a ΔΣ-modulating unit 12, a PWM-signal generating unit 13, a reset circuit 14, a PWM-signal amplifying unit 15, and a D-flip-flop circuit 17.

(1-1) Normal Mode

While the digital amplifier apparatus 10 is operating in the normal mode, a Pulse-Code Modulation (PCM) signal S1 reproduced from, for example, a Compact Disc (CD) is input to the gain control unit 11.

The gain control unit 11 performs gain adjustment, either amplifying or attenuating the PCM signal S1 to a predetermined level, generating a PCM signal S2. The PCM signal S2 is supplied to the ΔΣ-modulating unit 12.

The ΔΣ-modulating unit 12 performs bit-length changing on the PCM signal S2 supplied from the gain control unit 11, which is, for example, a 16-bit signal, converting the signal S2 to a signal of fewer bits. Further, the ΔΣ-modulating unit 12 performs so-called noise shaping, thereby accomplishing ΔΣ modulation. The unit 12 then superposes a dither (namely, performing a so-called dither-on) on the signal, and generates ΔΣ-modulated data S3. The ΔΣ-modulated data S3 is supplied to the PWM-signal generating unit 13.

The dither is a signal component (noise component) of a higher frequency than that of the ΔΣ-modulated data S3. Once this signal component is superposed on the ΔΣ-modulated data S3, the S/N ratio will be smaller. Nevertheless, the strain that is aurally unpleasant is reduced, improving the quality of sound.

Figure 2:
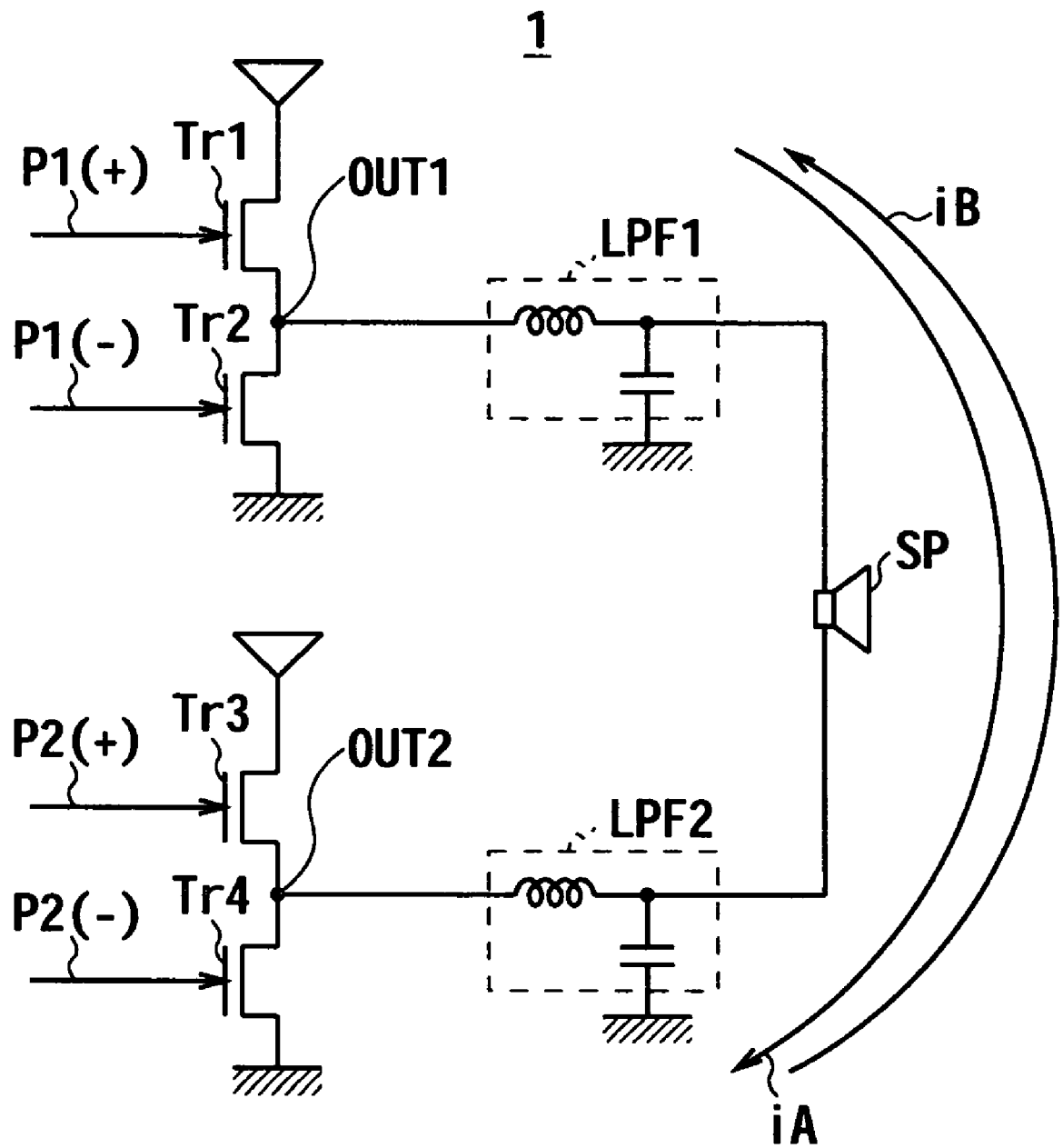
FIG. 2 is a diagram showing the configuration of a PWM-signal amplifying unit.
Figure 5:
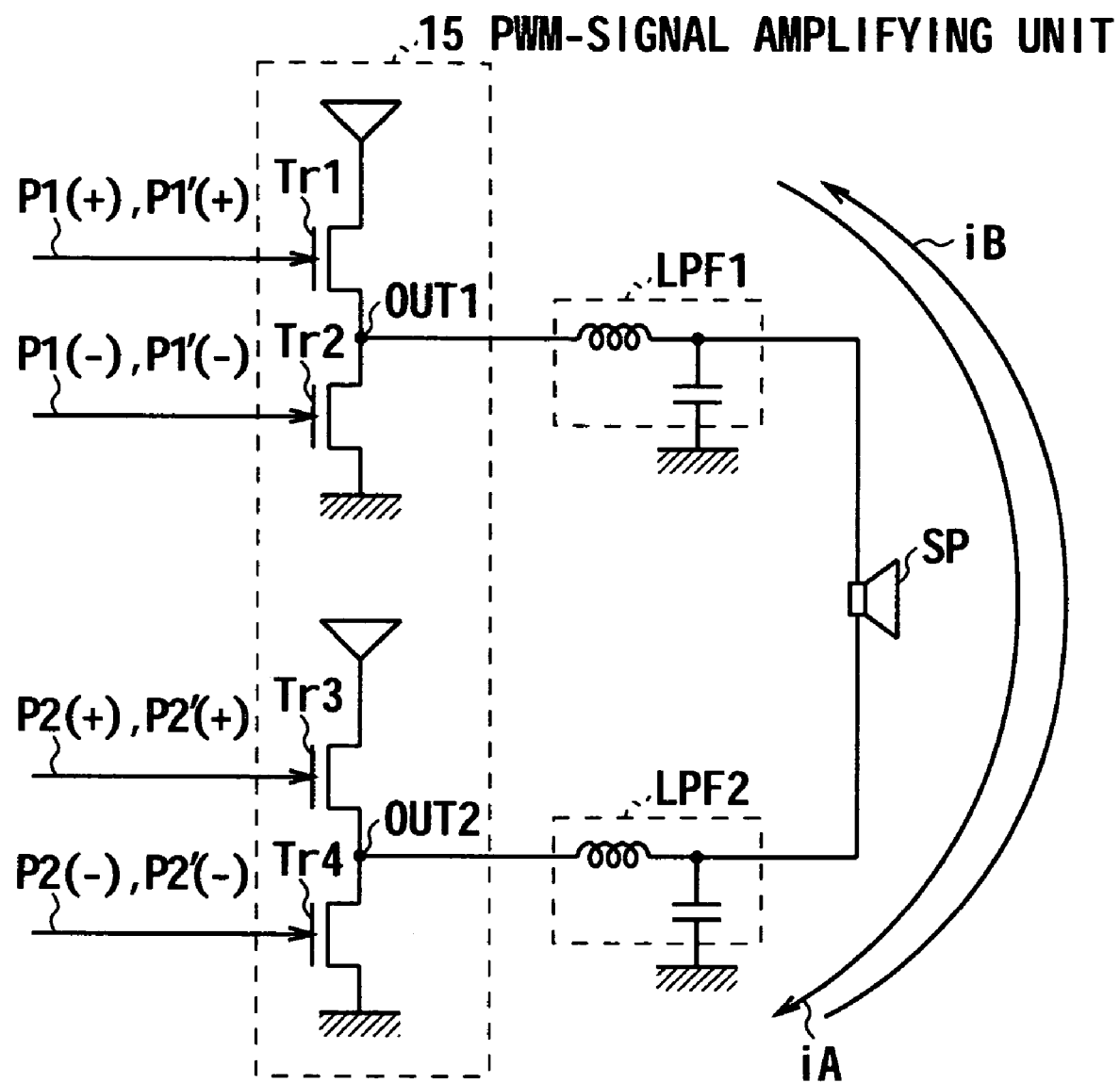
FIG. 5 is a diagram explaining a PWM signal to be supplied to a PWM-signal amplifying unit.

The PWM-signal generating unit 13 generates, from the modulated data S3, PWM signals P1(+), P1(−), P2(+) and P2(−) for switching the transistors Tr1 to Tr4 of the PWM-signal amplifying unit 15, because the PWM-signal amplifying unit 15 is of Bridge-Tied Load (BTL) type as shown in FIG. 5 in which the components identical to those depicted in FIG. 2 are designated at the same reference numbers. The PWM signals thus generated are supplied to the PWM-signal amplifying unit 15 in the normal mode.

That is, in the digital amplifier apparatus 10, the PWM signals P1(+), P1(−), P2(+) and P2(−) generated by the PWM-signal generating unit 13 are supplied to the PWM-signal amplifying unit 15 via the reset circuit 14 in the normal mode, without undergoing any process.

Figures 3A, 3B, 3C:
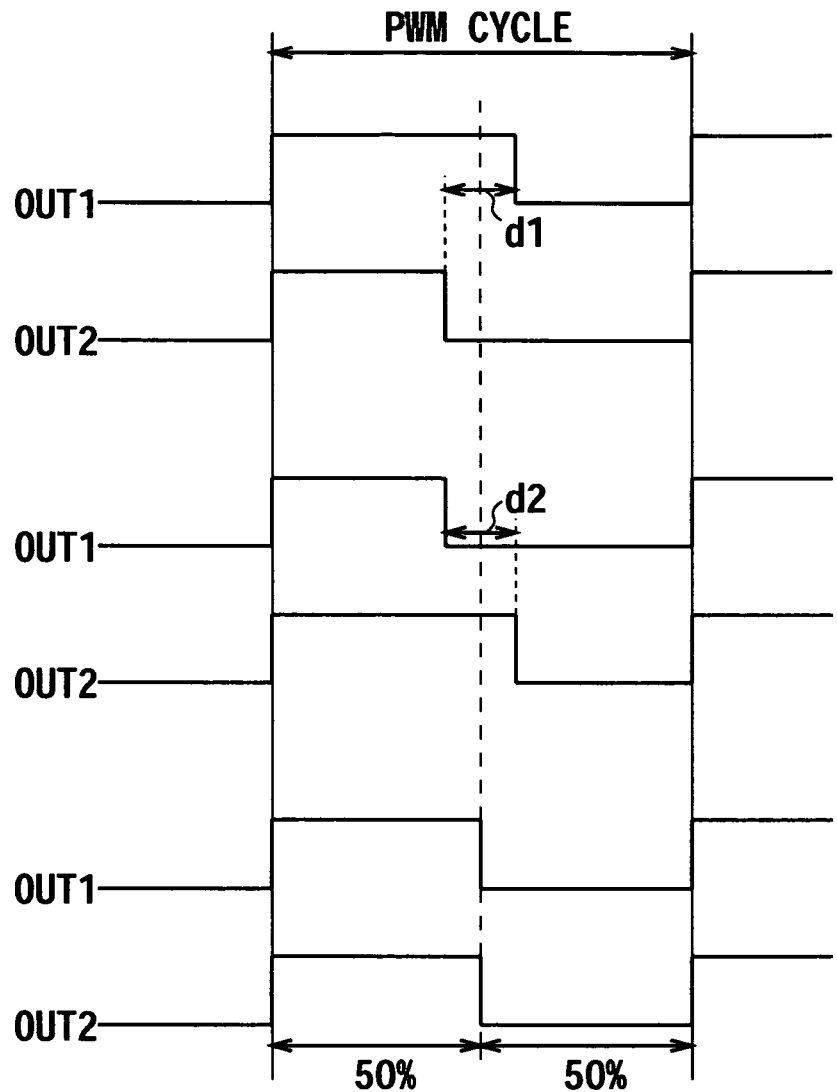
FIGS. 3A to 3C are diagrams explaining how a duty ratio changes.

In the PWM-signal amplifying unit 15, the PWM signal P1(+) is supplied to the gate of the transistor Tr1, turning on the transistor Tr1. At this time, the PWM signal P1(−), which is opposite in phase to the PWM signal P1(+), is supplied to he gate of the transistor Tr2, turning off the transistor Tr2. Further, the PWM signal P2(−) is supplied to the gate of the transistor Tr4, turning on the transistor Tr4. At this time, the PWM signal P2(+), which is opposite in phase to the PWM signal P2(−), is supplied to the gate of the transistor Tr3, turning off the transistor Tr3. As a result, as shown in FIG. 3A, a difference is imposed between the duty ratio of the PWM output OUT1 generated by the transistors Tr1 and Tr2 and the duty ratio of the PWM output OUT2 generated by the transistors Tr3 and Tr4. A drive current iA corresponding to the resultant potential difference d1 is made to flow to the speaker SP, which generates sound.

Further, in the PWM-signal amplifying unit 15, the PWM signal P1(−) is supplied to the gate of the transistor Tr2, turning on the transistor Tr2. At this time, the PWM signal P1(+), which is opposite in phase to the PWN signal P1(−), is supplied to the gate of the transistor Tr1, turning off the transistor Tr1. The PWM signal P2(+) is supplied to the gate of the transistor Tr3, turning on the transistor Tr3. At this time, the PWM signal P2(−), which is opposite in phase to the PWM signal P2(+), is supplied to the gate of the transistor Tr4, turning off the transistor Tr4. As a result, such a difference as shown in FIG. 3B is imposed between the duty ratio of the PWM output OUT1 generated by the transistors Tr1 and Tr2 and the duty ratio of the PWM output OUT2 generated by the transistors Tr3 and Tr4. A drive current iB corresponding to the resultant potential difference d2 is made to flow to the speaker SP, which generates sound.

In the digital amplifier apparatus 10, when the user performs the reset operation such as turning off the power source, while the speaker SP is generating sound in the normal mode, a reset signal R1 is supplied to the control unit 16 to make the speaker SP stop generating sound. The signal R1 is used as a trigger, switching the operating mode of the apparatus 10 from the normal mode to the resetting mode.

(1-2) Resetting Mode

Figure 6:
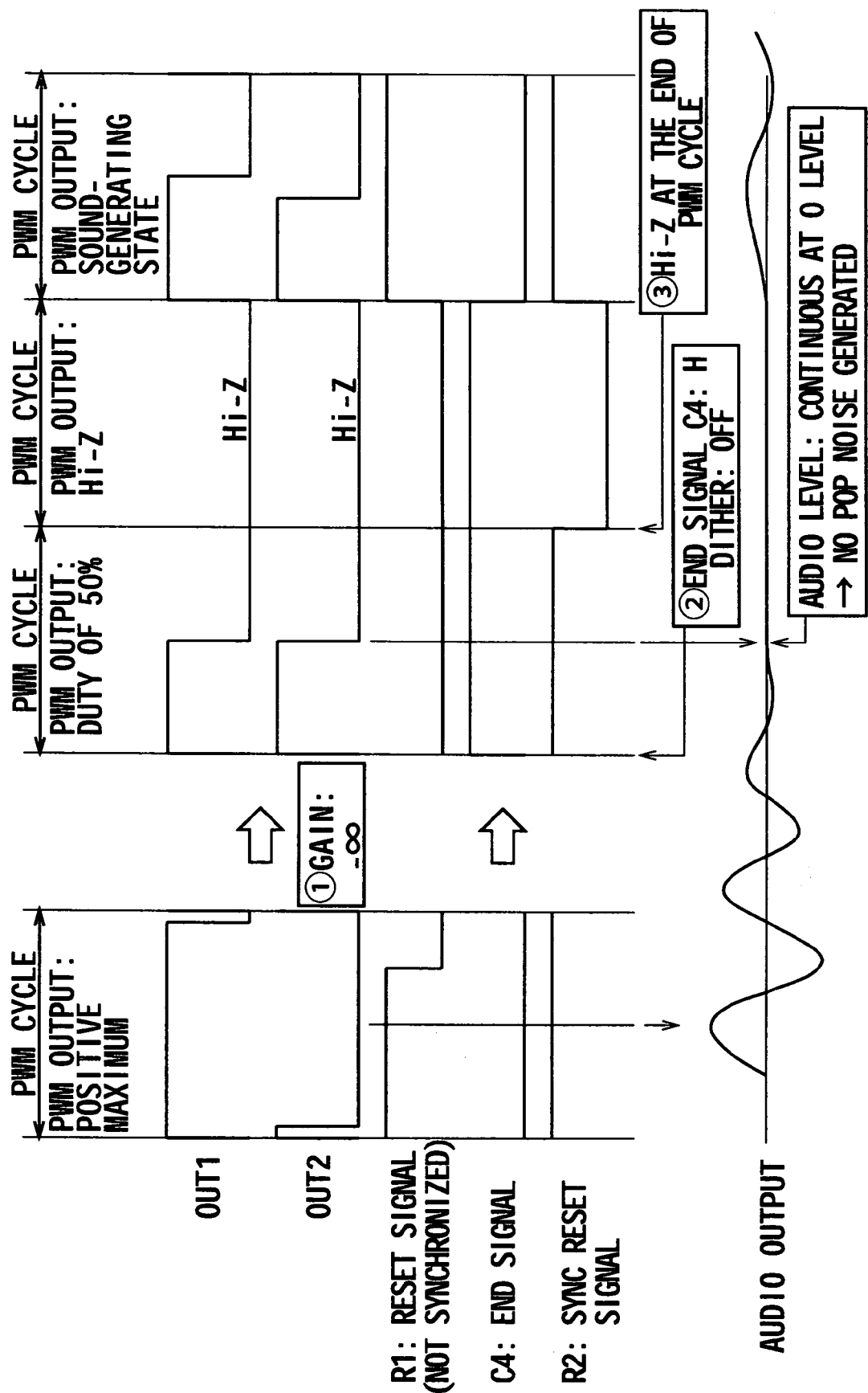
FIG. 6 is a diagram representing the reset timing in the embodiment of the present invention.

In the digital amplifier apparatus 10, the reset signal R1 may be supplied to the control unit 16 as shown in FIG. 6 when the user performs the reset operation, while the speaker SP is generating sound in the normal mode because a difference is imposed between the duty ratio of the PWM output OUT1 and that of the PWM output OUT2. In this case, the operation mode of the apparatus 10 changes from the normal mode to the resetting mode.

When the operating mode changes to the resetting mode, the control unit 16 (FIG. 4) supplies a control signal C1 to the gain control unit 11, so that the gain of the PCM signal S1 may come to have value of $-\infty$.

In accordance with the control signal C1 supplied from the control unit 16, the gain control unit 11 adjusts the gain of the PCM signal S1 to $-\infty$.

The gain control unit 11 multiplies the PCM signal S1 by a coefficient "0," attenuating the PCM signal S1 to the anacoustic level, generating an anacoustic-level PCM signal S2. The anacoustic-level PCM signal S2 is supplied to the $\Delta\Sigma$-modulating unit 12. Further, the gain control unit 11 generates a process-result signal C2 to the control unit 16, informing the control unit 16 that the gain has been so adjusted.

Upon receipt of the process-result signal C2 from the gain control unit 11, the control unit 16 supplies a command signal C3 to the $\Delta\Sigma$-modulating unit 12, causing the unit 12 to perform $\Delta\Sigma$-modulation on the PCM signal S2.

The $\Delta\Sigma$-modulating unit 12 is configured to $\Delta\Sigma$-modulate the PCM signal S2 to generate $\Delta\Sigma$-modulated data S3. In the resetting mode, however, the unit 12 does not superpose a dither (that is, it performs so-called dither-off), unlike in the normal mode. The unit 12 supplies the $\Delta\Sigma$-modulated data S3 to the PWM-signal generating unit 13 and supplies an end signal C4 to the control unit 16, informing that the $\Delta\Sigma$-modulated data S3 has been supplied to the PWM-signal generating unit 13.

The PWM-signal generating unit 13 supplies PWM signals P1(+), P1(−), P2(+) and P2(−) generated from the $\Delta\Sigma$-modulated data S3, to the reset circuit 14, because the PWM-signal amplifying unit 15 is of Bridge-Tied Load (BTL) type.

The $\Delta\Sigma$-modulated data S3 has been gain-controlled to a anacoustic level by the gain control unit 11 and has not been superposed with a dither, either. The data S3 is therefore at the perfectly anacoustic level.

The PWM outputs OUT1 generated by switching the transistors Tr1 and Tr2 by using the PWM signals P1(+) and P1(−) generated from the $\Delta\Sigma$-modulated data S3 that is at a completely anacoustic level and the PWM outputs OUT2 generated by switching the transistors Tr3 and Tr4 by using the PWM signals P2(+) and P2(−) generated from the $\Delta\Sigma$-modulated data S3 that is at a completely anacoustic level have a duty ratio of 50% and the same phase. Hence, neither the drive current iA nor the drive current iB (FIG. 5) flows to the speaker SP. Thus, the speaker SP can be stopped, no longer generating sound.

However, the speaker SP may generate an audio output, though being small, unless the PWM output OUT1 of the transistors Tr1 and Tr2 and the PWM output OUT2 of the transistors Tr3 and Tr4 have the same phase and a duty ratio of perfectly 50% in the digital amplifier apparatus 10.

In the digital amplifier apparatus 10 according to the embodiment of the present invention, the control unit 16 supplies a reset signal R1 to the input of the D-flip-flop circuit 17 upon receiving the reset signal R1 generated as the user performed the reset operation. The reset signal R1 will cause the speaker SP to stop generating sound.

The control unit 16 is designed to recognize that the gain of the $\Delta\Sigma$-modulated data S3 has been adjusted to the anacoustic level, when it receives the end signal C4 (FIG. 6) from the $\Delta\Sigma$-modulating unit 12 in the resetting mode. On recognizing this, the control unit 16 outputs an enable signal EN1 to the EN input of the D-flip-flop circuit 17.

On the other hand, the PWM-signal generating unit 13 supplies a PWM-cycle signal PT1 to the CLK input of the D-flip-flop circuit 17. Note that the PWM-cycle signal PT1 represents the cycles of the PWM outputs OUT1 and OUT2 that are synchronous with the system clock signal CLK of the digital amplifier apparatus 10.

Thus, upon receipt of the enable signal EN1 from the control unit 16, the D-flip-flop circuit 17 outputs a reset signal R2 to the reset circuit 14 in accordance with the PWM-cycle signal PT1, while temporarily holding the reset signal R1 supplied to the D input from the control unit 16 (FIG. 4). Note that the reset signal R2 (hereinafter called sync reset signal R2) is synchronous with the cycle-ends of the PWM outputs OUT1 and OUT2.

When the reset circuit 14 receives the sync reset signal R2 from the D-flip-flop circuit 17, it changes the states of the PWM signals P1(+), P1(−), P2(+) and P2(−) and the periods for which these PWM signals remain in the "high" state and the "low" state, and generates PWM signals P1'(+), P1'(−), P2'(+) and P2'(−) that are all at "low" state. The PWM signals thus generated are supplied to the PWM-signal amplifying unit 15.

In the PWM-signal amplifying unit 15, no gate voltages are applied to the transistors Tr1 and Tr2 since the PWM signals P1'(+) and P1'(−) are in a completely "low" state at this time. The transistors Tr1 and Tr2 are turned off, terminating the switching operation of the PWM-signal amplifying unit 15. The PWM output OUT1 having a duty ratio of 50% is thereby changed to a PWM output OUT1 that remains in the "low" state after the end of the PWM cycle.

At this time, the PWM signals P2'(+) and P2'(−) are also in a completely "low" state in the PWM-signal amplifying unit 15. No gate voltages are applied to the transistors Tr3 and Tr4. The transistors Tr3 and Tr4 are turned off, terminating the switching operation. The PWM output OUT2 having a duty ratio of 50% is thereby changed to a PWM output OUT2 that remains in the "low" state after the end of the PWM cycle.

In the digital amplifier apparatus 10, the PWM-signal amplifying unit 15 can therefore be set to a high impedance with respect to the reset circuit 14, at the end of the PWM cycle when the sync reset signal R2 is output to the reset circuit 14. Therefore, the supply of the drive currents iA and iB from the PWM-signal amplifying unit 15 to the speaker SP can be completely stopped, thereby to cause the speaker SP to stop generating sound.

When the digital amplifier apparatus 10 is set back into the normal mode from the resetting mode, a difference is made between the PWM outputs OUT1 and OUT2 in the next PWM cycle. The drive currents iA and iB are then supplied to the speaker SP. The speaker SP therefore starts generating sound again.

(1-3) Sequence of the Resetting Process

Figure 7:
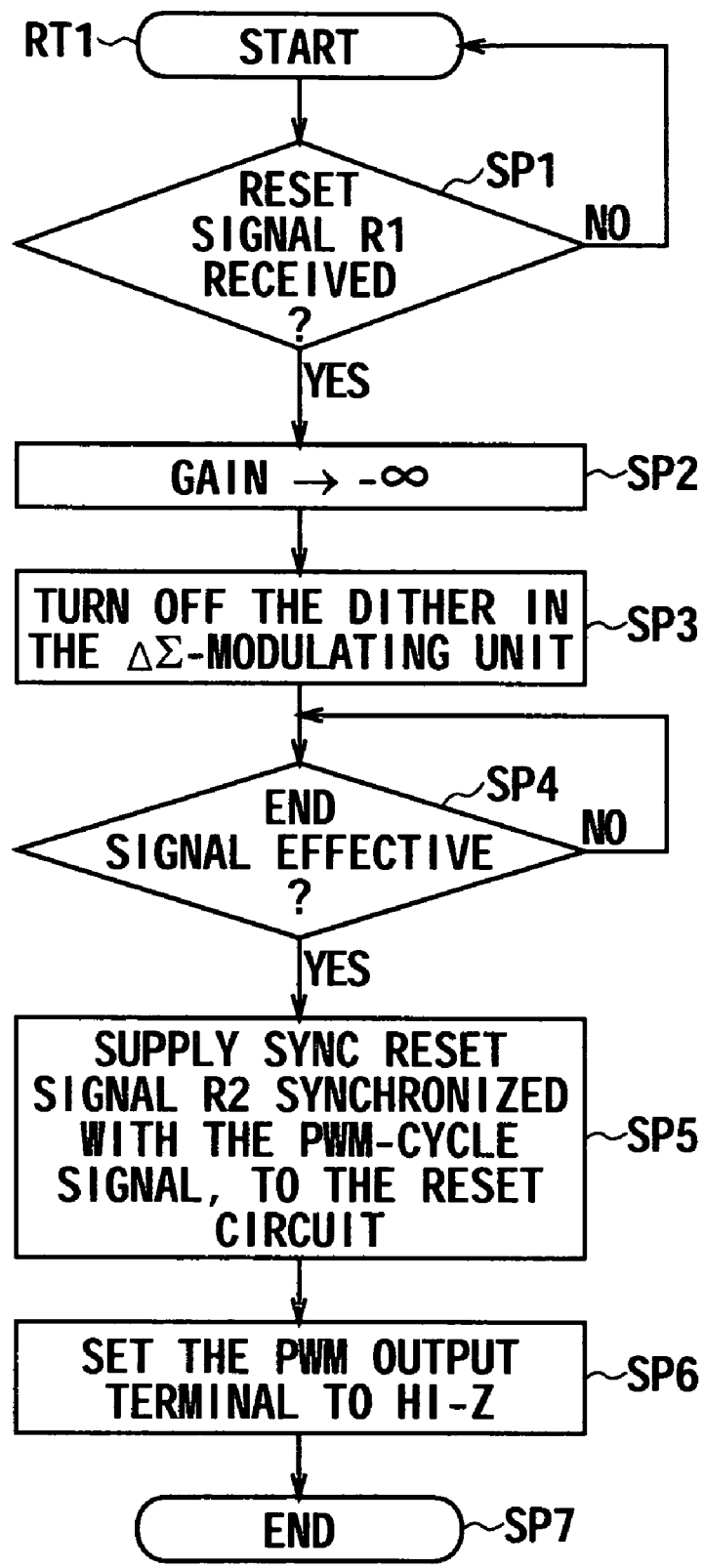
FIG. 7 is a flowchart illustrating the sequence of a resetting process according to the embodiment of the present invention.

The sequence of the resetting process that is performed while the digital amplifier apparatus 10 is set in the resetting mode will be explained, with reference to the flowchart of FIG. 7.

The control unit 16 of the digital amplifier apparatus 10 starts operating in the start step of routine RT1. The control unit 16 then goes to Step SP1. In Step SP1, the control unit 16 determines whether the reset signal R1 has been received. If NO, the control unit 16 waits for the reset signal R1 and performs the normal-mode processes. If YES in Step SP1, the control unit 16 recognizes a reset command and goes to the next step, i.e., Step SP2.

Having received the reset signal R1, in Step SP2, the control unit 16 causes the gain control unit 11 to adjust the gain of the PCM signal S1 to the value of $-\infty$. Thus, the unit 11 attenuates the PCM signal S1 to an anacoustic level, thus generating a PCM signal S2. Then, the control unit 16 goes to the next step, i.e., Step SP3.

In Step SP3, the control unit 16 causes the $\Delta\Sigma$-modulating unit 12 to perform $\Delta\Sigma$-modulation on the PCM signal S2 and turns off the dither, generating $\Delta\Sigma$-modulated data S3 at the anacoustic level. Then, the control unit 16 goes to the next step, i.e., Step SP4.

In Step SP4, the control unit 16 determines whether the gain adjustment and the dither-off process have been effectively performed, from the end signal C4 supplied from the $\Delta\Sigma$-modulating unit 12. If NO, the control unit 16 waits for the end signal C4 until the gain adjustment and the dither-off process are effectively performed. If YES, the unit 16 goes to the next step, i.e., Step SP5.

In Step SP5, the control unit 16 recognizes that $\Delta\Sigma$-modulated data S3 has been generated because of the gain adjustment and the dither-off process effectively performed. The unit 16 outputs the sync reset signal R2 synchronized with the PWM-cycle signal PT1, to the reset circuit 14. The reset circuit 14 therefore supplies the PWM signals P1'(+), P1'(−), P2'(+) and P2'(−) to the PWM-signal amplifying unit 15. Then, the control unit 16 goes to the next step, i.e., Step SP6.

In Step SP6, the control unit 16 stops the operation of the transistors Tr1 to Tr4 of the PWM-signal amplifying unit 15 by using the PWM signal P1'(+), P1'(−), P2'(+) and P2'(−). Therefore, the transistors Tr1 and Tr2 stop performing the switching operation, and the transistors Tr3 and Tr4 stop performing the switching operation. The PWM output terminal of the PWM-signal amplifying unit 15 is thereby set to a high impedance with respect to the component connected to the input of the PWM-signal amplifying unit 15. Therefore, the supply of the drive currents iA and iB to the speaker SP is completely stopped. The control unit 16 then goes to the next step, Step SP7, terminating the process.

(2) Operation and Advantage

In the digital amplifier apparatus 10 of the configuration described above, when the PWM-signal generating unit 13 receives the reset signal R1, it generates PWM signals P1(+), P1(−), P2(+) and P2(−) from the $\Delta\Sigma$-modulated data S3 at the anacoustic level, which has been gain-controlled to the anacoustic level and subjected to the dither-off. Nonetheless, the PWM signals P1'(+), P1'(−), P2'(+) and P2'(−) generated in response to the sync reset signal R2 supplied from the D-flip-flop circuit 17 at the end of the PWM cycle of the PWM outputs OUT1 and OUT2 stop the operation of the transistors Tr1 to Tr4 of the PWM-signal amplifying unit 15. Hence, the switching operation is stopped in the PWM-signal amplifying unit 15. Thus, neither the drive current iA nor the drive current iB is supplied to the speaker SP.

In the PWM-signal amplifying unit 15, the PWM signals P1'(+), P1'(−), P2'(+) and P2'(−) stop the operation of the transistors Tr1 to Tr4 of the PWM-signal amplifying unit 15. The PWM outputs OUT1 and OUT2 of the PWM-signal amplifying unit 15 are thereby controlled to assume a high-impedance state. Thus, neither the drive current iA nor the drive current iB is supplied to the speaker SP. The speaker SP therefore stops generating sound. Hence, even if the speaker SP is abruptly reset from the sound-generating state, it can assume an anacoustic state, without generating pop noise.

Since the digital amplifier apparatus 10 generates PWM signals P1(+), P1(−), P2(+) and P2(−) from the $\Delta\Sigma$-modulated data S3 that is at a completely anacoustic level. The speaker SP can therefore stop generating sound at the time both PWM outputs OUT1 and OUT2 come to have the same phase and a duty ratio of 50%. At this time, however, the switching operation is still proceeding. Therefore, the PWM outputs OUT1 and OUT2 of the PWM-signal amplifying unit 15 are set into the high-impedance state at the end of the PWM cycle, thus stopping the supply of the drive currents iA and iB to the speaker SP. The speaker SP can therefore be set into a completely anacoustic state.

Figure 1:
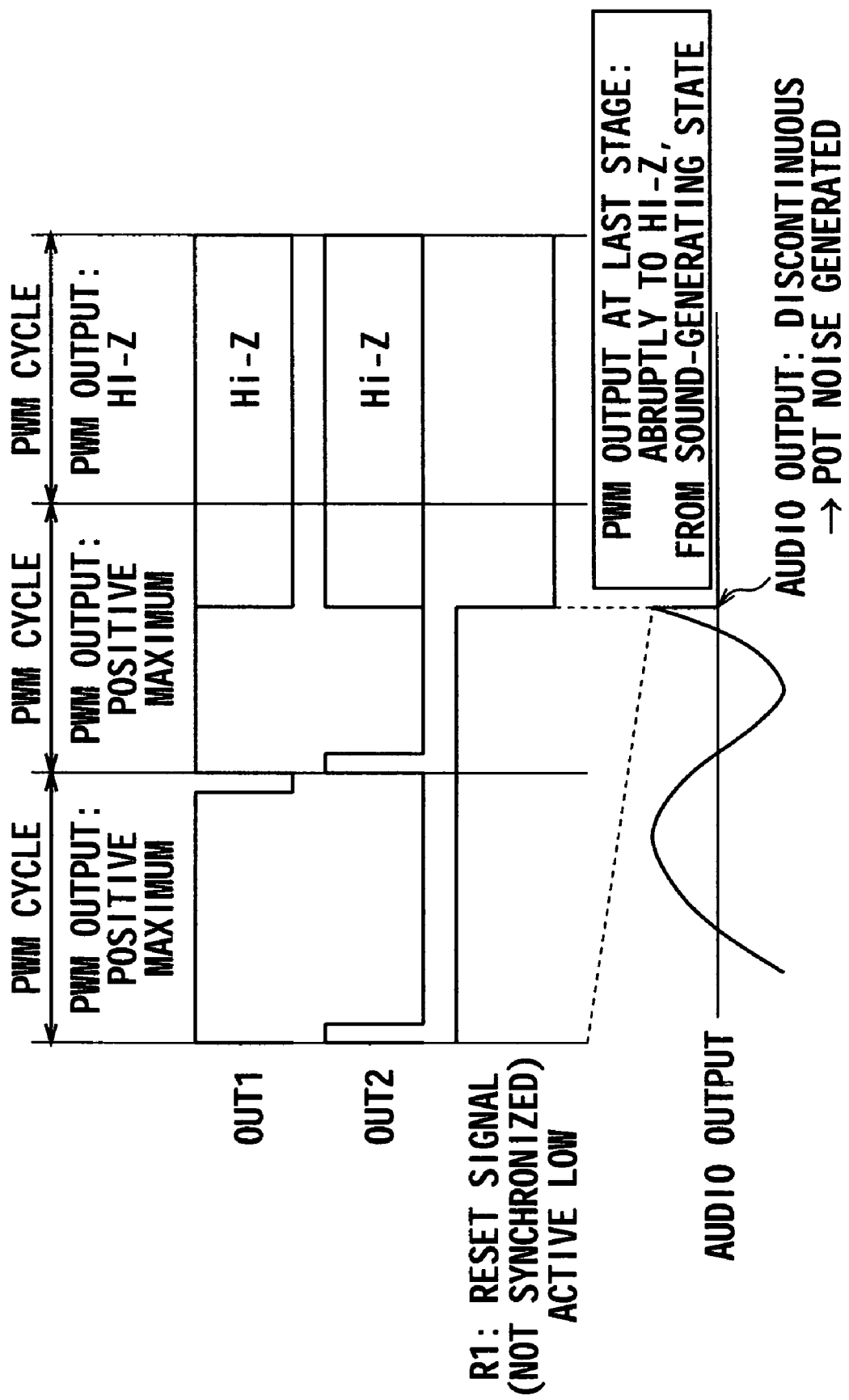
FIG. 1 is a diagram illustrating the sequence of a conventional resetting timing.

By contrast, in the conventional digital amplifier apparatus, the PWM outputs OUT1 and OUT2 of the PWM-signal amplifying unit 15 are set into the high-impedance state at the time the reset signal R1 is received as shown in FIG. 1. The sound-generating state at a prescribed acoustic level is abruptly changed to a sound-generating state at 0-level, i.e., anacoustic state. So-called pop noise is inevitably generated.

In the digital amplifier apparatus 10 according to the embodiment of the present invention, the gain of the PCM signal S1 is adjusted to the value of $-\infty$ and subjected to the dither-off process. The signal S1 is thereby set to a completely anacoustic level. Thereafter, the PWM outputs OUT1 and OUT2 of the PWM-signal amplifying unit 15 are set into the high-impedance state. Thus, the supply of the drive currents iA and iB to the speaker SP can be stopped at the sound-generating state at 0-level where the acoustic level is not abruptly changed. The speaker can therefore stop generating sound, without making pop noise.

The digital amplifier apparatus 10 is so configured that no gate voltages are applied to the gates of the transistors Tr1 and Tr2 and those of the transistors Tr3 and Tr4 in order to set the PWM outputs OUT1 and OUT2 of the PWM-signal amplifying unit 15 to the "low" state after the end of the PWM cycle. Thus, no feedthrough current keeps flowing from the power supply toward the ground even if the transistors Tr1 and Tr2 or the transistors Tr3 and Tr4 are turned on at the same time due to, for example, the malfunction of the gate driver. This can reliably prevent the breakdown of the transistors Tr1 and Tr2 and that of the transistors Tr3 and Tr4.

The digital amplifier apparatus 10 configured as described above is not so complex in structure and can yet completely stop the speaker, making it stop generating sound and assume an anacoustic state, without generating pop noise.

(3) Other Embodiments

The embodiment described above is so configured that the PWM outputs OUT1 and OUT2 of the PWM-signal amplifying unit 15 are controlled to assume a high-impedance state, at the end of the PWM cycle of the PWM outputs OUT1 and OUT2. The present invention is not limited to the embodiment, nevertheless. The PWM outputs OUT1 and OUT2 may be controlled to assume the high-impedance state, when the PWM outputs OUT1 and OUT2 of the PWM-signal amplifying unit 15 have a duty ratio of 50% and the same phase and the speaker output is stopped.

The embodiment described above is a digital amplifier apparatus 10 that has a PWM-signal amplifying unit 15 of BTL type. This invention is not limited to such a digital amplifier apparatus. It can be applied to a digital amplifier apparatus that has a PWM-signal amplifying unit of single-end type.

In the embodiment described above, i.e., a digital amplifier apparatus, includes a gain control unit 11 used as a gain-adjusting unit, a ΔΣ-modulating unit 12 used as a dither-superposing unit, a PWM-signal generating unit 13 used as a pulse-width-modulated signal generating unit, a PWM-signal amplifying unit 15 used as an amplifying unit, a control circuit 16 used as a control unit, a D-flip-flop circuit 17, and a reset circuit 14. This invention is not limited to this configuration. The digital amplifier apparatus may include a gain-adjusting unit, a dither-superposing unit, a pulse-width-modulated signal generating unit, an amplifying unit and a control unit, which have various circuit configurations.

A digital amplifier apparatus and a method of resetting a digital amplifier apparatus, both according to the embodiment of the present invention, can be applied to such uses that a speaker stops generating an output without generating noise at all, when the apparatus is reset to make the speaker stop generating an output to assume an anacoustic state.

It should be understood by those skilled in the art that various modifications, combinations, sub-combinations and alterations may occur depending on design requirements and other factors insofar as they are within the scope of the appended claims or the equivalents thereof.

The invention claimed is:

1. A digital amplifier apparatus, comprising:
gain-adjusting means for adjusting a gain of a digital audio signal;
dither-superposing means for superposing a predetermined dither on the digital audio signal;
pulse-width-modulated signal generating means for generating a pulse-width-modulated signal corresponding to the digital audio signal;
amplifying means for causing a switching element to perform a switching operation for amplification in accordance with the pulse-width-modulated signal;
pulse-width changing means for changing a ratio between a "high" state and a "low" state of the pulse-width modulated signal;
synchronizing means for synchronizing the pulse-width modulated signal with a reset signal that resets the digital audio signal; and
control means for performing a resetting operation by setting the gain of the digital audio signal to a zero level upon receiving the reset signal, for stopping the superposing of the dither to thereby generate the pulse-width modulated signal, and for setting the pulse-width modulated signal to the "low" state by using the pulse-width modulated signal synchronized with the reset signal, thereby causing the switching element to stop performing the switching operation.

2. The digital amplifier apparatus according to claim 1, wherein
upon receiving the reset signal, the control means performs a resetting operation by setting the pulse-width modulated signal to the "low" state at the end of a cycle of the pulse-width modulated signal that has been synchronized with the reset signal, thereby causing the switching element to stop performing the switching operation.

3. The digital amplifier apparatus according to claim 1, wherein the amplifying means is an amplifier circuit of a Bridge-Tied Load (BTL) type that includes two of the switching elements for performing the switching operation for amplification in accordance with the pulse-width-modulated signal.

4. The digital amplifier apparatus according to claim 1, wherein the amplifying means is an amplifier circuit of a single-end type having one element identical to the switching element.

5. A method of resetting a digital amplifier that adjusts a gain of a digital audio signal, superposes a predetermined dither on the digital audio signal, generates a pulse-width modulated signal corresponding to the digital audio signal having the dither added, and resets the digital amplifier in accordance with the pulse-width modulated signal, the method comprising:
recognizing a reset command upon receiving a predetermined reset signal;
synchronizing the reset signal with the pulse-width modulated signal;
setting the gain of the digital audio signal to a zero level and then stopping the superposing of the dither when the reset command is recognized;
generating the pulse-width modulated signal corresponding to the digital audio signal whose gain has been adjusted; and
performing a resetting operation by setting the pulse-width modulated signal to a "low" state by using the pulse-width modulated signal synchronized with the reset signal.

6. The method according to claim 5, wherein
the step of performing the resetting operation includes, upon receipt of the reset signal, setting the pulse-width modulated signal to the "low" state at the end of a cycle of the pulse-width modulated signal that has been synchronized with the reset signal.

7. A digital amplifier apparatus, comprising:
a gain-adjusting section operable to adjust a gain of a digital audio signal;
a dither-superposing section operable to superpose a predetermined dither on the digital audio signal;
a pulse-width-modulated signal generating section operable to generate a pulse-width-modulated signal corresponding to the digital audio signal;
an amplifying section operable to cause a switching element to perform a switching operation for amplification in accordance with the pulse-width-modulated signal;
a pulse-width changing section operable to change a ratio between a "high" state and a "low" state of the pulse-width-modulated signal;
a synchronizing section operable to synchronize the pulse-width-modulated signal with a reset signal that resets the digital audio signal; and
a control section operable to perform a resetting operation by setting the gain of the digital audio signal to a zero level upon receiving the reset signal, stopping the superposing of the dither to thereby generate the pulse-width-modulated signal, and setting the pulse-width-modulated signal to the "low" state by using the pulse-width-modulated signal synchronized with the reset signal, thereby causing the switching element to stop performing the switching operation.

* * * * *